US005977789A

United States Patent [19]

Gayles

[11] Patent Number: 5,977,789

[45] Date of Patent: Nov. 2, 1999

[54] FAST-SWITCHING LOGIC GATE

[75] Inventor: Eric S. Gayles, Milipitas, Calif.

[73] Assignee: Intel Corporation, Santa Clara, Calif.

[21] Appl. No.: 08/918,975

[22] Filed: Aug. 27, 1997

[51] Int. Cl.[6] .................... H03K 19/017; H03K 19/096

[52] U.S. Cl. .................... 326/17; 326/98; 326/121

[58] Field of Search .................... 326/95–98, 17, 326/27–28, 112, 119, 121

[56] References Cited

U.S. PATENT DOCUMENTS

| 4,804,867 | 2/1989 | Okitaka et al. | 326/98 |
|---|---|---|---|
| 5,646,557 | 7/1997 | Runyon et al. | 326/96 |
| 5,854,567 | 12/1998 | Meier et al. | 326/95 |

OTHER PUBLICATIONS

Friedman et al., "Dynamic Logic CMOS Circuits," IEEE Journal of Solid–State Circuits, vol. SC–19, No. 2, pp. 263–266 (1984).

Heller et al., "Cascode Voltage Switch Logic: A Differential CMOS Logic Family," Proceedings of 1984 IEEE International Solid State Circuits Conference, pp. 16–17 (1984).

Krambeck et al., "High–Speed Compact Circuits with CMOS," IEEE Journal of Solid–State Circuits, vol. SC–17, No. 3, pp. 614–619 (1982).

*Primary Examiner*—Jon Santamauro
*Attorney, Agent, or Firm*—Blakely, Sokoloff, Taylor & Zafman LLP

[57] ABSTRACT

A logic device that allows the implementation of a fast-switching logic gate is described. One implementation of the logic device includes an output node and a reference node electrically isolated from one another by a transmission gate. During a first period of time, the nodes are charged to complementary logic levels. During a second period of time, the transmission gate is enabled, allowing the charge on the nodes to be redistributed. A pair of complementary input terminals are connected to the reference and output nodes, such that if the input terminal connected to the output node is at the same logic level as the output node during the first period, then the voltage level of the output node is pulled back from its redistributed state to its original state. However, if the input terminal voltage level to the output node is the complement of the original voltage level of the output node, then a charge/discharge circuit is enabled to pull the output node to a voltage level that is a complement to its original voltage level.

24 Claims, 7 Drawing Sheets

FAST-SWITCHING LOGIC GATE

BACKGROUND OF THE INVENTION

1. Field of the Invention

The invention relates in general to logic devices, and more particularly to a fast-switching logic gate.

2. Description of the Related Art

With the growing complexity of modem computer systems, designers are constantly seeking more efficient methods to reduce power and cost, while increasing speed. Generally, the major components in a computer system are formed from the combination of millions of logic gates. Typically, the power, cost, and speed of the components correlate to the operation efficiency of these logic gates. The switching speed of a logic gate is generally defined in the art as the time that it takes for the output terminal to reflect a change at the input terminal. By significantly improving the performance of the logic gate, the overall performance of the computer system can be improved.

FIG. 1 illustrates six MOS (metal oxide semiconductor) transistors 100, 102, 104, 120, 122, 124 connected to form a conventional static CMOS (complementary MOS) logic gate. The transistors essentially function as switches. These switches are normally open, which prevents current from flowing (i.e., charge from redistributing) and corresponds to the transistor being "off." Transistors can be turned "on" by applying a voltage to an enable input terminal. N-type transistors are turned "on" when a high voltage level is applied to the enable input terminal, while P-type transistors are turned "on" when a low voltage level is applied to the enable input terminal. A high voltage level as defined in this application is a voltage level that is approximately equal to a reference voltage, while a low voltage level is approximately equal to a ground voltage. When a node has a high voltage level applied, it is designated as being in a "high" state. A node is designated as being in a "low" state when a low voltage level is applied to the node. The specifics regarding P-type and N-type transistors have not been included because they would be known by one of ordinary skill.

The transistor 100 is a P-type transistor with an enable input terminal 105 referred to as an input terminal A. When a low voltage level is applied to the input terminal A, the transistor 100 "turns on," connecting a reference voltage level $V_{ref}$ to an output node 110, forcing the output node 110 to a "high" state. At approximately the same time, the low voltage level at the input terminal A is also applied to an enable input terminal 115 of an N-type transistor 120. However, the N-type transistor 120 does not "turn on." One skilled in the art will appreciate that when the input terminals A, B, and C are high, all of the P-type transistors 100, 102, 104 in is FIG. 1 will be "off," while all of the N-type transistors 120, 122, 124 will be "on." When any of the input terminals (i.e., A, B, or C) are low, a high voltage level approximately equal to the reference voltage $V_{ref}$ is present at the output node 110. Similarly, when all of the input terminals A, B, and C are high, the output node 110 is connected to ground and a low voltage level is present at the output node 110. The circuit shown in FIG. 1 is configured to implement a logical NAND gate.

Disadvantages of the logic gate of FIG. 1 include the use of several N-type and P-type transistors, which generally requires a larger surface area. Typically, an increase in the surface area has a corresponding increase in cost. Connection of both N-type and P-type transistors may also hinder the switching speed. If, for example, the input terminals A, B, and C were designated as being in the low state and then changed to the high state, the P-type transistors 100, 102, 104 would be "turning off" while the N-type transistors 120, 122, 124 are "turning on." Generally, it takes longer for the P-type transistors to "turn off" than it does for the N-type transistors to "turn on." Thus, there is a period when both the P-type and the N-type transistors 100, 102, 104, 120, 122, 124 may be "on," which can delay the output node 110 from achieving the desired state (e.g., a low state). Also, with all of the transistors 100, 102, 104, 120, 122, 124 turned "on," current flows from $V_{ref}$ to ground, increasing the power consumed by the static CMOS logic gate.

In this example, the N-type transistors 120, 122, 124 operate to apply a low voltage level at the output node 110, while the P-type transistors 100, 102, 104 operate to apply a high voltage level at the output node 110. Thus, there is a type of "fighting" that may occur between the P-type transistors 100, 102, 104 and the N-type transistors 120, 122, 124. In this case, the output node 110 will not fully discharge (i.e., to go to a low voltage level) until after all of the P-type transistors 100, 102, 104 "turn off." This causes a delay between the time the input terminals A, B, and C change and the time the output node 110 reflects the change. This delay results in a decreased switching speed.

FIG. 2A illustrates a conventional, ideal domino logic gate 199, which includes one P-type transistor 200 and several N-type transistors 210, 215, 220, 225 serially connected together. A master common clock signal is applied to the enable input terminal of the P-type transistor 200. When the clock signal is low (i.e., has a low voltage level), the transistor 200 "turns on," applying a high voltage to an output node 205. The same clock signal is applied to the N-type transistor 210, which causes the transistor 210 to remain off during the same period. Enabling the P-type transistor 200 (i.e., turning the P-type transistor "on"), and disabling the N-type transistor 210 causes the output node 205 to be in a high state. Varying the voltage applied to the enable input terminals A, B, and C of the N-type transistors 215, 220, 225 can cause the output node 205 to discharge (i.e., go to a low state). For example, if the input terminals A, B, and C were all at a high voltage level while the clock was at a low voltage level, such that all of the N-type transistors 210, 215, 220, 225 were "turned on," then the output node 205 could begin to discharge. The logic gate 199 shown in FIG. 2A is configured to implement a logical NAND gate.

Problems with the circuit of FIG. 2A include charge-sharing, which can cause an incorrect state at the output node 205. For example, if the input terminal A and input terminal B are high, the transistors 215 and 220 would be "on." Thus, some of the charge present at the output node 205 can be redistributed to the intermediate nodes 216 and 230. The charge shift to the intermediate nodes 216 and 230 can cause the voltage level present at the output node 205 to drop substantially, causing the high voltage level to be seen as a low voltage level. This can cause the logic gate 199 to function improperly.

FIG. 2B illustrates a modified domino logic gate 231, which includes an additional P-type transistor 235 and an inverter 240. The enable input terminal of the P-type transistor 235 is connected to the output terminal of the inverter 240. When the voltage level of the clock is low, the output node 205 is at a high voltage level, which causes the output terminal of the inverter 240 to be at a low voltage level. The low voltage level from the inverter 240 is applied to the enable input terminal of the P-type transistor 235, which causes that transistor to "turn on." When the transistor 235 is "on," it helps to maintain a high voltage level at the output node 205. The logic gate 231 shown in FIG. 2B is configured to implement a logical NAND gate.

If the input terminals A, B, and C have a high voltage level applied, the N-type transistors 215, 220, 225 apply a low voltage to the output node 205, while the P-type transistor 235 applies a high voltage. The output node 205 cannot fully discharge until the P-type transistor 235 "turns off" which causes a delay and limits the switching speed of the logic gate 231. In addition, during this period where both the P-type and N-type transistors are "on" wasted current flows from $V_{ref}$ to ground. Moreover, the logic gate of FIG. 2B still has a similar potential for charge-sharing as described in conjunction with the logic gate 199 of FIG. 2A.

FIG. 3 shows a conventional Cascode Voltage Switch Logic (CVSL) gate which may function similarly to two domino gates. One side of the circuit charges while the other side of the circuit discharges. CVSL is known in the art as a dual-rail structure. This type of structure employs an inverted input terminal for each input terminal. Thus, in FIG. 3 input terminals A–F have corresponding inverted input terminals A*–F*. Generally, a dual-rail structure employs a larger area and more power. In addition, CVSL may also have "fighting" during the discharge cycle, which can cause the switching speed to be limited. If sense amplifiers are placed on both out and out* nodes to achieve more sensitive detection, noise present at either the out or out* nodes will also be amplified, which can cause the gate to malfunction.

Thus, it would be beneficial to have a fast-switching logic gate for use with computer systems that is capable of overcoming the shortcomings of conventional methods.

SUMMARY OF THE INVENTION

In a first embodiment of the present invention a logic device is provided that includes an output node, a reference node, a first and second transistor, a transmission gate, and a circuit. The first transistor has a first terminal adapted to be coupled to a first voltage source, an enable input terminal coupled to receive a clock signal, and a second terminal coupled to the output node. The second transistor has a first terminal coupled to a second voltage source, an enable input terminal coupled to receive the clock signal, and a second terminal coupled to the reference node. The transmission gate has an enable input terminal coupled to receive the clock signal, a first terminal coupled to the output node, and a second terminal coupled to the reference node. The transmission gate is adapted to couple the reference and output nodes together during a second preselected portion of the clock signal. The circuit has a first enable input terminal coupled to the reference node, a second enable input terminal coupled to receive the clock signal, a first terminal coupled to the output node, and a second terminal adapted to be coupled to the first voltage source. The circuit is adapted to pull the voltage level at the output node to the first voltage source during a second preselected portion of the clock signal.

In a second embodiment of the present invention, a method of operating a fast switching logic device is provided. The method includes: isolating an output node from a reference node; placing a first charge on the output node; placing a second charge on the reference node; redistributing the first and second charges; and placing an output charge on the output node.

BRIEF DESCRIPTION OF THE DRAWINGS

Objects and advantages of the invention will become apparent upon reading the following detailed description and upon reference to the drawings in which.

Figure 1:
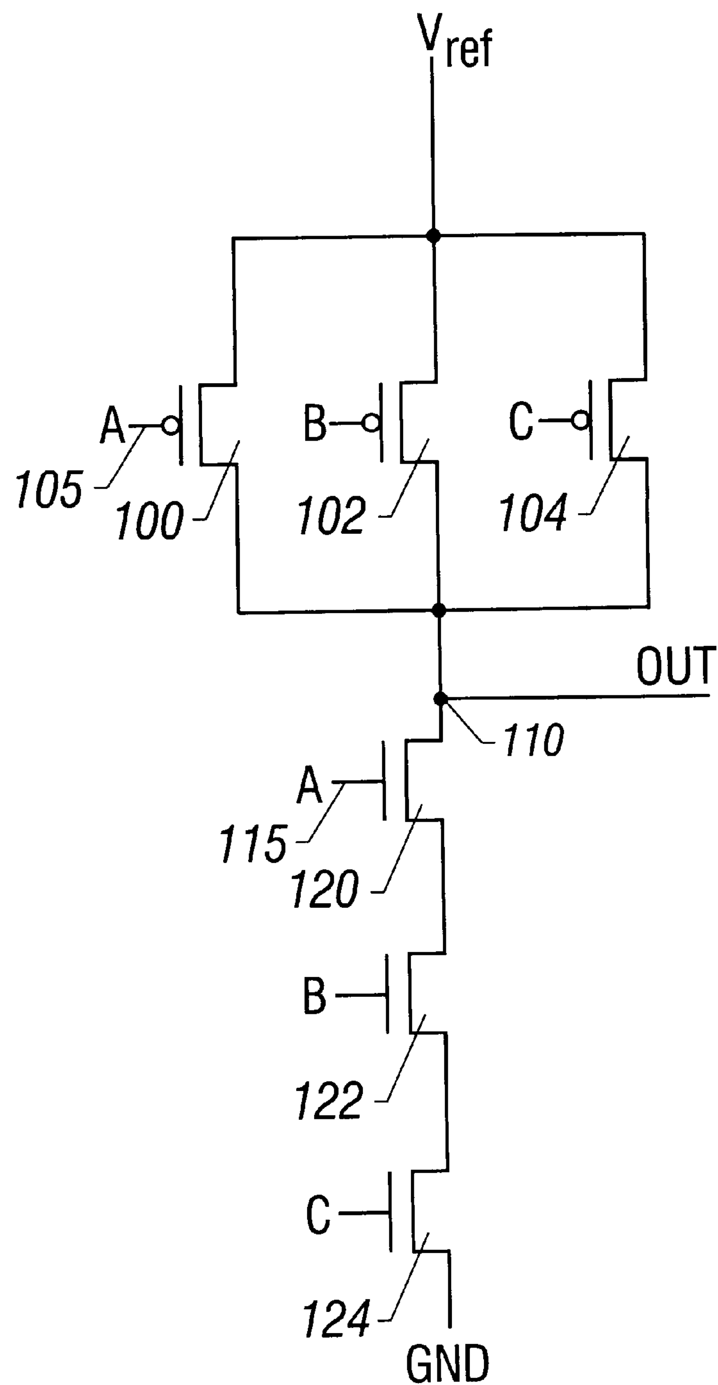
FIG. 1 illustrates a conventional static CMOS logic circuit.
Figure 2B:
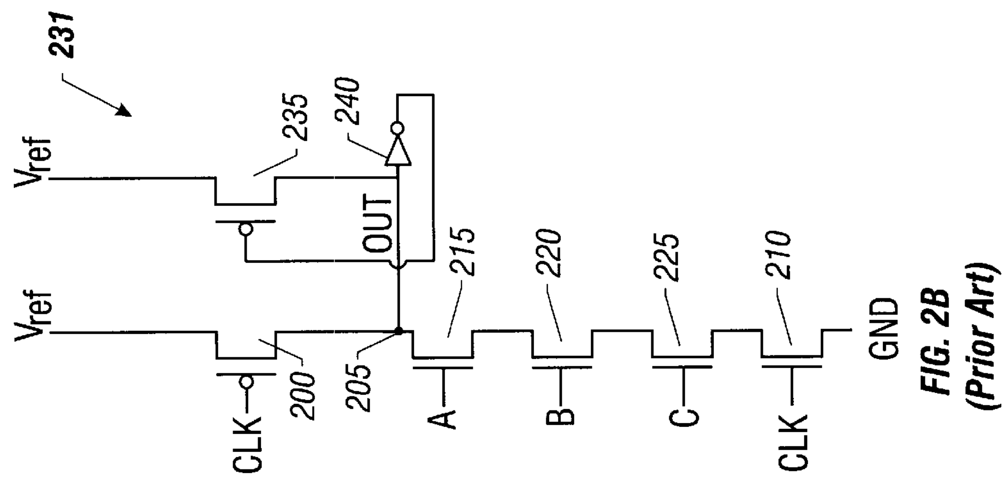
FIGS. 2A and 2B illustrate conventional domino logic circuits.
Figure 2A:
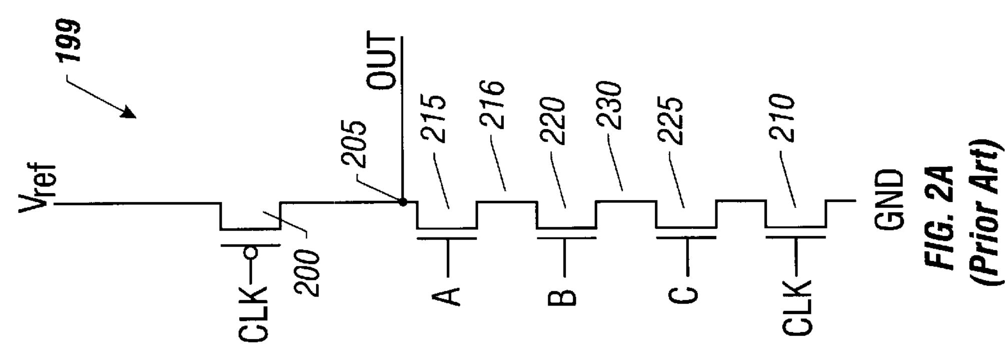
Figure 3:
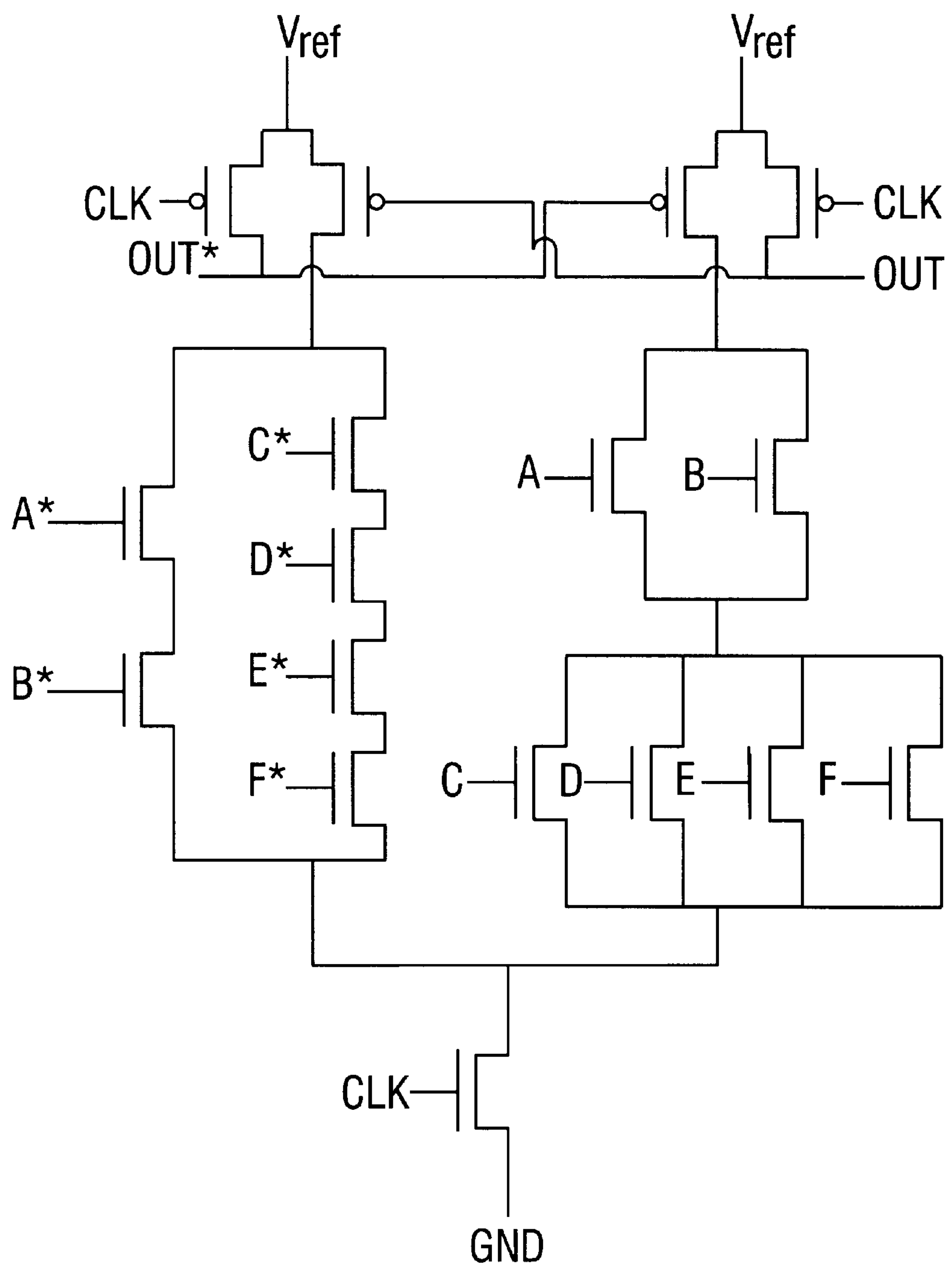
FIG. 3 illustrates a conventional CVSL circuit.

While the invention is susceptible to various modifications and alternative forms, specific embodiments have been shown by way of example in the drawings and are described in detail. It should be understood, however, that the description herein of specific embodiments is not intended to limit the invention to the particular forms disclosed; on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in a fast-switching logic gate. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill having the benefit of this disclosure.

Overview

Figures 4A, 4B:
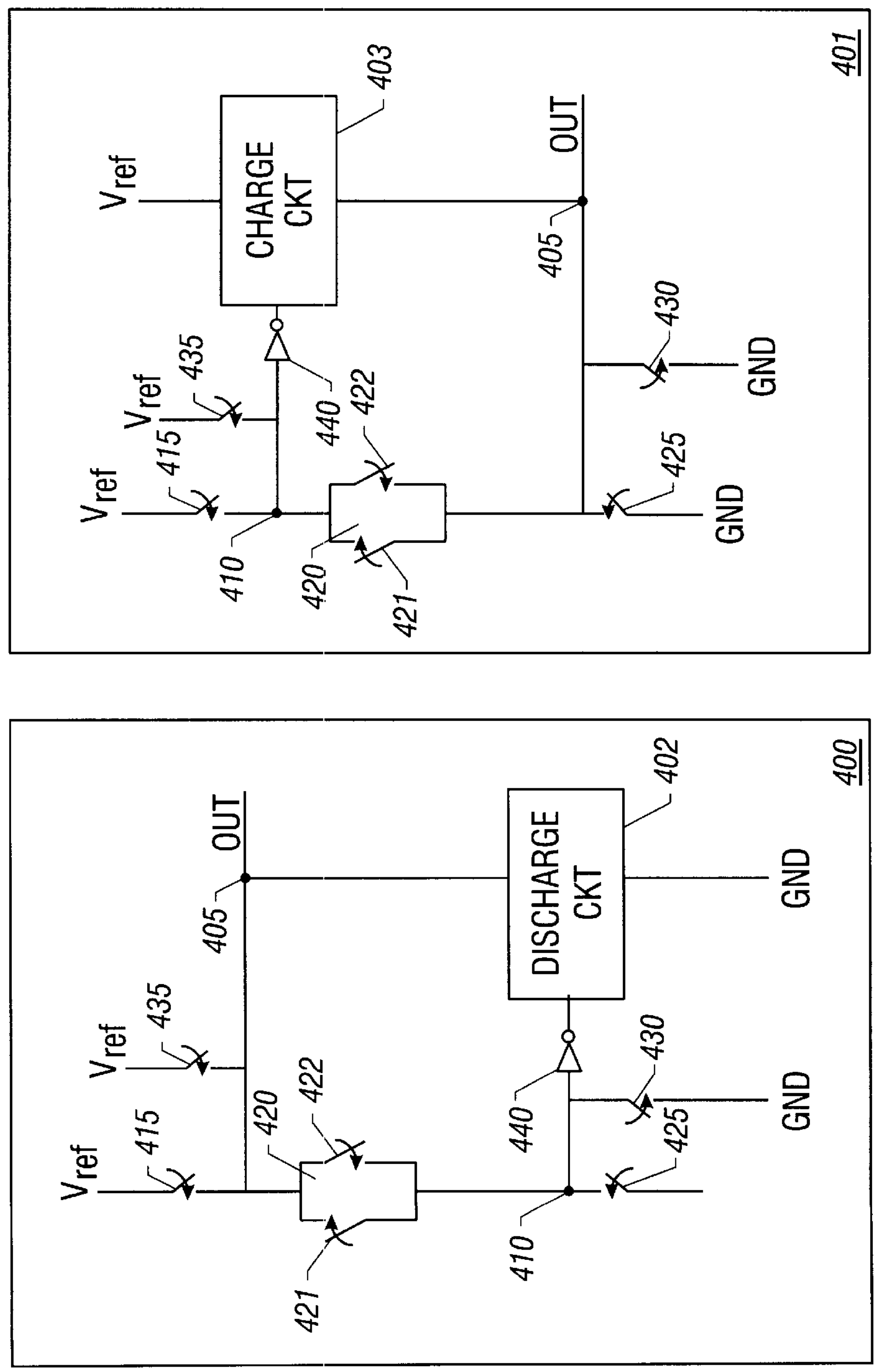
FIGS. 4A and 4B are simplified circuit diagrams in accordance with the invention.

FIGS. 4A and 4B are simplified drawings of fast-switching logic devices 400 and 401 constructed in accordance with this invention. FIG. 4A is a logic device (e.g., a logic gate) 400 in which the output terminal is normally designated as being "high" (i.e., the output node is in a high state). FIG. 4B is a circuit diagram illustrating a logic device 401 that can be used to build a logic gate in which the output terminal is normally designated as being "low." A discharge circuit 402 of FIG. 4A and a charge circuit 403 of FIG. 4B can be used to change the output terminal of the logic gate to a "non-normal" state. For example when the output terminal of the logic device 400 should be low, the discharge circuit 402 can be used to quickly discharge the output terminal (i.e., cause the output terminal to go to a "low" state). Similarly, the charge circuit 403 of FIG. 4B can be used to quickly charge the output terminal, causing the output terminal to be designated as "high." Logic gates built from logic devices in accordance with the invention will provide faster switching times than conventional logic gates.

FIG. 4A is a simplified drawing of a first embodiment of a logic gate 400 constructed in 10 accordance with the invention. The logic gate 400 contains an output node 405 and a reference node 410. A switch 415 is connected between a reference voltage $V_{ref}$ and the output node 405. When the switch 415 is closed, a voltage approximately equal to $V_{ref}$ appears at the output node 405. Voltage levels approximately equivalent to $V_{ref}$ are generally designated as being in a high state. A transmission gate 420 also has an input terminal connected to the output node 405 and is an output terminal connected to the reference node 410. The transmission gate 420 contains two switches 421, 422 that are normally open. When the switches 421, 422 close, charge can redistribute, allowing the voltage level of the output node 405 and the reference node 410 to change.

A switch 425 is connected between the reference node 410 and a ground voltage (i.e., voltage designated as electrical ground). Voltage levels approximately equivalent to ground are designated as being in a low state. When the switch 425 is closed, a low voltage level is present at the reference node 410. An gate input circuit 430, connected in parallel with the switch 425, can be used to help maintain a low state at the reference node 410. Similarly, gate input circuit 435, connected in parallel with the switch 415, can be used to help maintain a high state at the output node 405.

An inverter 440 has an input terminal connected to the reference node 410 and an output terminal connected to the discharge circuit 402. The inverter 440 inverts the voltage level at its input terminal and applies thast voltage level to its output terminal. The discharge circuit 402 is also connected to the output node 405 and to the ground voltage. As previously mentioned, the discharge circuit 402 can be used to "pull down" the voltage at the output node 405 to a voltage level approximately equal to the ground voltage, thereby enabling a "low" signal to be applied to the output node 405.

The logic device 400 is similar to the logic device 401, as evident by the use of similar numbering; however, some differences are present. The switch 415, the gate input circuit 435, the inverter 440, and the input terminal of the transmission gate 420 are connected to the reference node 410 instead of the output node 405. The switch 425, the gate input terminal 430, the output terminal of the transmission gate 420, and the output terminal of the charge circuit 403 are connected to the output node 405. The logic device 401 normally rests in a low state, which occurs when the switch 425 is closed. However, the upper portion of the circuit connected to the reference node 410 can be used to generate a high signal at the output node 405 by connecting the output node 405 to $V_{ref}$ through the charge circuit 403.

A First Embodiment

Figure 5:
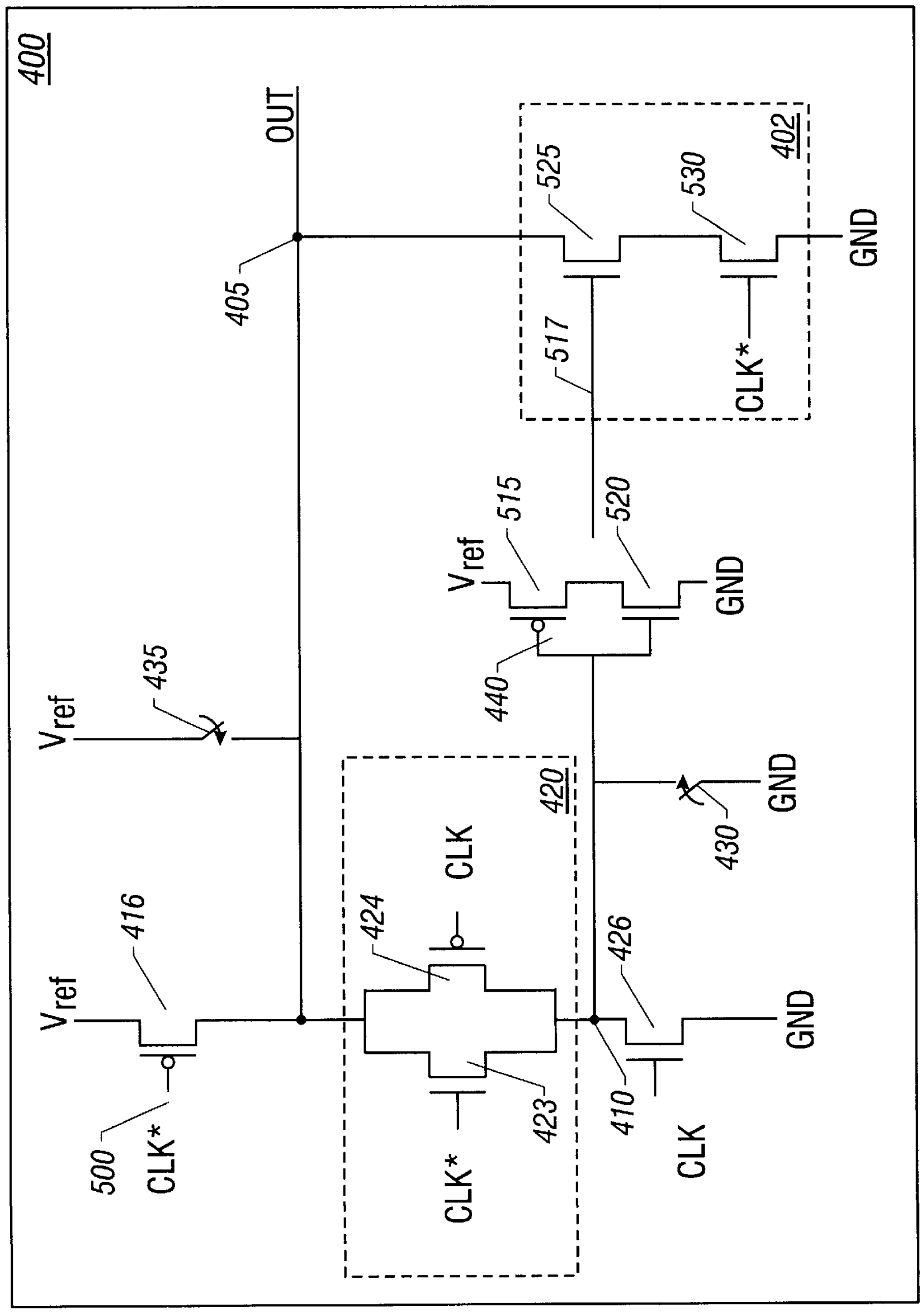
FIG. 5 is a circuit diagram for a first embodiment of the invention.

FIG. 5 shows a more detailed view of the logic gate 400 of FIG. 4A. The symbolic representation of the switch 415 shown in FIG. 4A has been replaced by a P-MOS transistor 416. Similarly, an N-MOS transistor 426 has replaced the symbolic representation of the switch 425 shown in FIG. 4A. One skilled in the art will appreciate that any type of semiconductor technology that allows for complementary transistors (e.g., P-MOS and N-MOS) can be used to make the switches 415 and 425. The switch 415 is closed by applying a voltage to an enable input terminal 500, which is connected to an inverted clock output terminal CLK*. If, for example, the inverted clock output terminal is "low" and is applied to the enable input terminal 500, the P-MOS transistor 416 will conduct (i.e., switch 415 will close), placing the output node 405 in a "high" state. One skilled in the art will appreciate that an inverted clock output terminal may be generated by inverting a clock signal.

The switches 421 and 422 within the transmission gate 420 are formed from complementary transistors 423, 424, whose input terminals and output terminals are connected. The transistor 423 is an N-MOS transistor with an enable connected to the the inverted clock output terminal CLK*. The input terminal of the transistor 423 is connected to the output node 405, and the output terminal of the transistor 423 is connected to the reference node 410. Similarly, the input terminal of the transistor 424 is connected to the output node 405, and the output terminal is connected to the reference node 410. The transistor 424 is a complement (e.g., a P-MOS transistor) of the transistor 423 and the enable of the transistor 424 is connected to a clock output terminal CLK.

The inverter 440 consists of two complementary transistors 515 and 520. The transistor 515 can be used to connect an output terminal 517 of the inverter 440 to a reference voltage $V_{ref}$. The transistor 520 can be used to connect the output terminal 517 of the inverter 440 to the ground voltage.

The discharge circuit 402 of FIG. 4A is constructed from two of the same type of transistors (e.g., N-MOS transistors) 525 and 530. The input terminal of the transistor 525 is connected to the output node 405, while the output terminal is connected to the input terminal of the transistor 530. The enable of the transistor 530 is connected to the inverted clock output terminal CLK*, while the output terminal of the transistor 530 is connected to the ground voltage. The enable of the transistor 525 is connected to the output terminal 517 of the inverter 440.

As shown, the output node 405 is generally in a high state, while the reference node 410 is generally in a low state. A device precharge state as defined in this application is the logic state that occurs when the clock output terminal CLK is "high" and the inverted clock output terminal CLK* is "low." When the inverted clock signal CLK* is in a low state, the transistor 416 is "on," which allows current to flow from the reference voltage supply to the output node 405. The voltage level of the output node 405 then becomes approximately equal to the reference voltage $V_{ref}$, which causes the output node 405 to be designated as being in a high state.

At the same time, the clock signal CLK is in a high state, which causes the transistor 426 to be "on," which connects the reference node 410 to the ground voltage. Connecting the reference node 410 to the ground voltage causes the state of the reference node 410 to be designated as being in a low state. The low state at the reference node 410 causes the transistor 515 to be "on" and the transistor 520 to be "off," placing the enable of the transistor 525 in a high state. The high state of the enable of the transistor 525 causes the transistor 525 to be "on." However, the "low" signal on the enable of the transistor 530 causes the transistor 530 to be "off." Thus, the output node 405 remains "high," while the reference node 410 remains "low" during this device precharge state. At this point, gate input circuits 430 and 435 have little effect on the output node 405 and the reference node 410.

When the clock signal CLK is "low" and the inverted clock signal CLK* is "high," a device evaluation state exists such that the logic gate 400 can be evaluated based on the voltage levels that are present at the gate input circuits 430 and 435. The high inverted clock signal is CLK* turns the transistor 416 "off," the transistor 423 "on," and the transistor 520 "off." At the same time, the low clock signal turns the transistor 424 "on" and the transistor 426 "off." Neither the output node 405 nor the reference node 410 are connected to either the ground voltage or the reference voltage $V_{ref}$. Thus, the values of these nodes 405, 410 are considered to be floating. Since the transistor 423 and the transistor 424 are "on," charge can redistribute, causing the voltage level at the reference node 410 to increase. If the increased voltage level of the reference node 410 is still less than the minimum voltage needed to turn the transistor 515 "off" and the transistor 520 "on," then the transistor 525 will remain "on." Thus, the discharge circuit 402 provides a path to discharge the output node 405.

If a high state is desired at the output node 405, the gate input circuit 430 will be "off", while the gate input circuit 435 will be "on." The gate input circuits 430 and 435 have been symbolically shown as switches. One skilled in the art will appreciate that these circuits could include several transistors of varying types in any of a variety of configurations. Examples of typical gate input circuits are shown and discussed in conjunction with FIGS. 7A–D, below.

When the gate input circuit 435 is "on," the output node 405 has a direct connection to the reference voltage $V_{ref}$, such that the voltage level at the output node 405 increases to approximately the reference voltage $V_{ref}$. Since the transmission gate transistors 423 and 424 are still "on," the voltage level of the reference node 410 increases as a result of the voltage increase at the output node 405. Once the voltage level of the reference node 410 increases beyond the voltage level needed to turn the transistor 515 "off" and the transistor 520 "on," the inverter 440 will cause the transistor 525 to turn "off." Turning "off" the transistor 525 disables the discharge circuit 402. The output node 405 will then be fully charged to approximately the reference voltage $V_{ref}$, and designated as a high state.

In contrast, when the output node 405 should be designated as a low state, the gate input circuit 435 is disabled, while the gate input circuit 430 is enabled. During the device evaluation state (i.e., when the clock CLK is low), the output node 405 and the reference node 410 are floating. "Turning on" the transmission gate 420 causes the voltage level at the reference node 410 to begin to rise. However, the gate input circuit 430 provides a direct connection of the reference node 410 to the ground voltage, thereby keeping the voltage level of the reference node 410 "low." The low voltage level at the reference node 410 causes the transistor 515 to remain operational, enabling the output node 405 to be discharged to approximately the ground voltage through the discharge circuit 402. In this case, the voltage level of the output node 405 can be designated as a low state.

The configuration of the logic gate 400 enables the output node 405 to be isolated from the reference node 410 during the device precharge state. The isolation enables the output node 405 to be charged to approximately the reference voltage $V_{ref}$, while the reference node 410 can be charged to approximately the ground voltage. However, closing the transmission gate 420 during the device evaluation state and controlling the gate input circuits 430, 435 can enable the output node 405 to change values when needed.

A Second Embodiment

Figure 6:
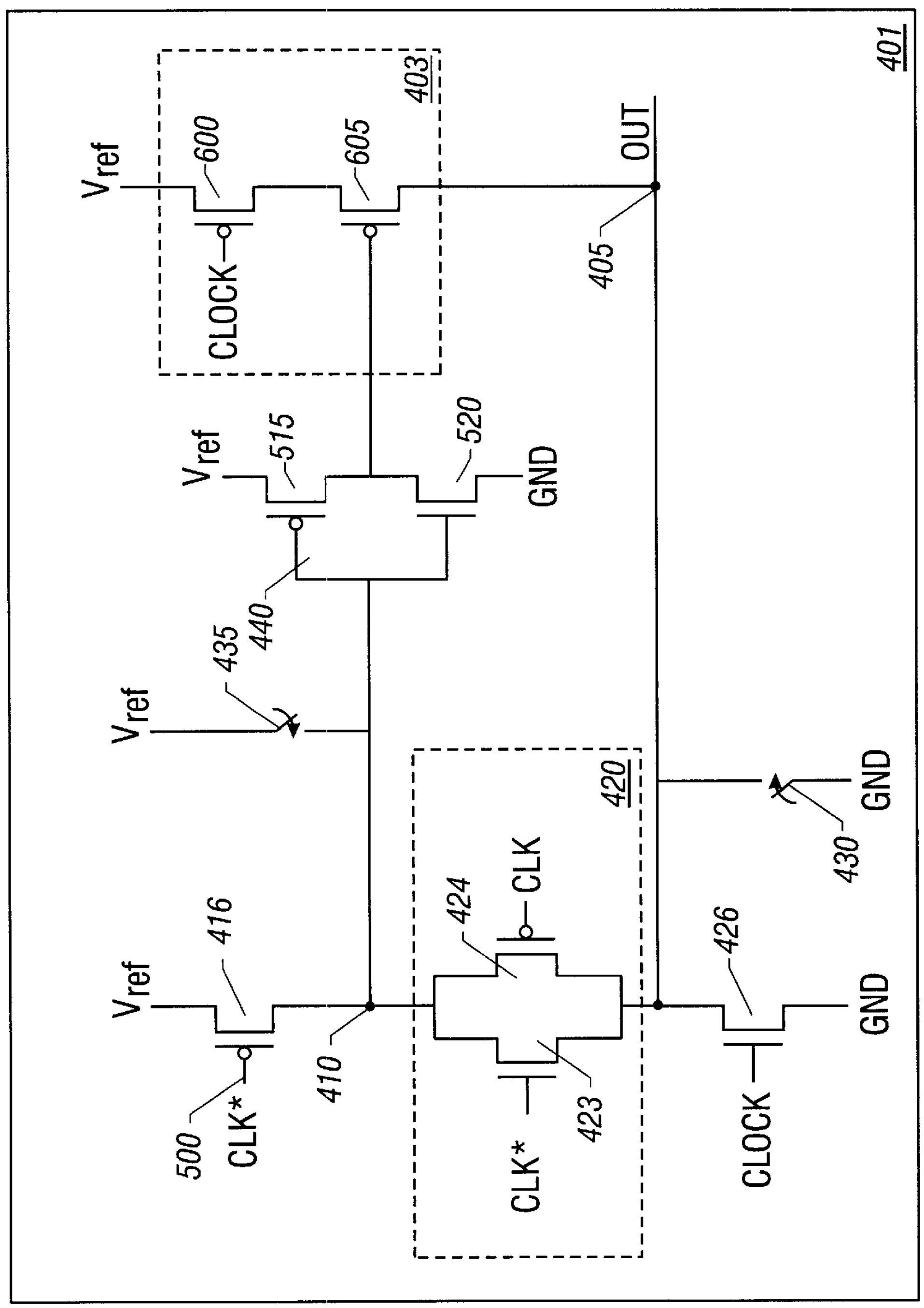
FIG. 6 is a circuit diagram for a second embodiment of the invention.

FIG. 6 is a detailed view of the logic gate 401 shown in FIG. 4B. As previously mentioned, similar numbers represent substantially similar circuit elements to those described above. However, the reference node 410, the output node 405, and the inverter 440 have changed position relative to their position in the embodiments of FIGS. 4A and 5. The transistor 416 has an output terminal connected to the reference node 410. When the transistor 416 is "turned on," the reference node 410 is charged to approximately the reference voltage $V_{ref}$. Similarly, "turning on" the transistor 426 charges the output node 405 to approximately the ground voltage. The configuration shown in FIG. 6 allows the reference node 410 to rest in a high state, while the output node 405 rests in a low state during the device precharge state.

When a low state is desired at the output node 405 during the device evaluation state (i.e., the clock signal CLK is low), the voltage levels at the reference node 410 and the output node 405 are floating. The gate input circuit 430 can be turned "on" to help maintain a low voltage level. The reference node 410, which originally was designated as being in a high state, shares some of its charge with the output node 405 through the transmission gate 420. Continual sharing causes the voltage level of the reference node 410 to continue to decrease such that the output terminal of the inverter 440 becomes a high voltage level, which "turns off" the transistor 605, causing the charge circuit 403 to be disabled. When charge circuit 403 "turns off," the output node 405 can change to a voltage level approximately equal to the ground voltage.

When a high state is desired at the output node 405 during the device evaluation state, the reference node 410 is floating "high," while the output node 405 is floating "low." The gate input circuit 435 can be turned "on" to help maintain a high voltage level on the reference node 410. Charge redistribution through the transmission gate 420 causes the voltage level of the output node 405 to increase. Since the gate input circuit 435 is "on," the "high" signal at the reference node 410 causes the output terminal of the inverter 440 to be low, which keeps the transistor 605 "on." The transistor 605 provides a connection of the output node 405 to the reference voltage $V_{ref}$, which enables the voltage level of the output node 405 to be designated as a high state.

Figure 7A:
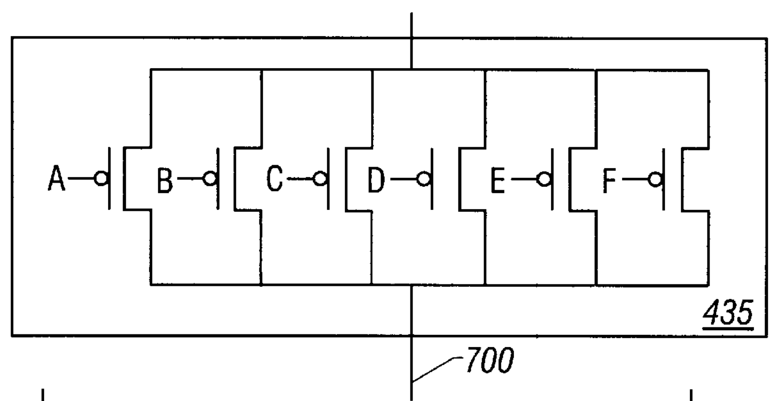
FIGS. 7A–7D illustrate possible configurations for the device input circuits of the present invention.
Figure 7B:
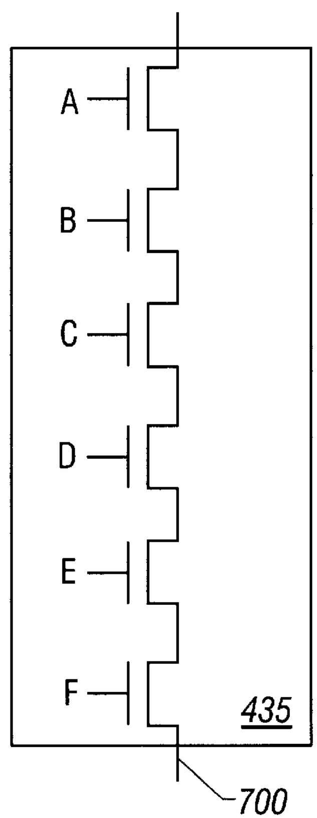
Figure 7C:
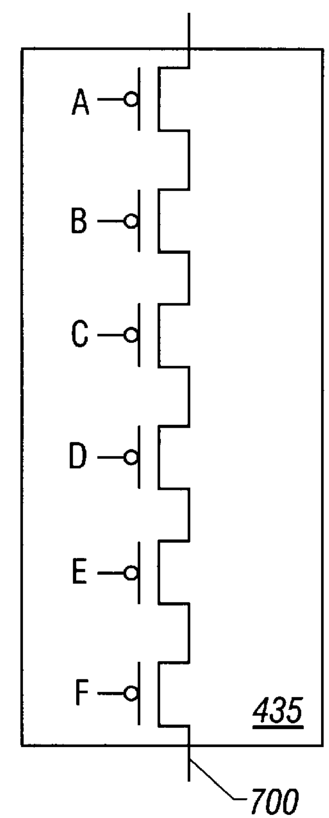
Figure 7D:
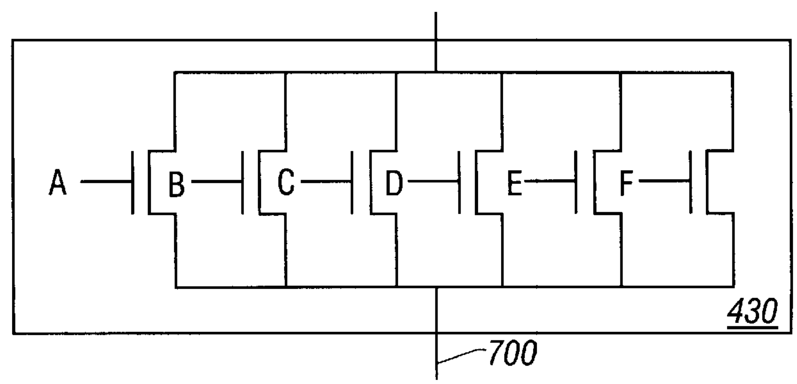

One skilled in the art will appreciate that the complexity of the gate input circuits 430 and 435 can vary depending on the desire of the circuit designer. FIGS. 7A–7D show possible configurations for the gate input circuits. FIGS. 7A and 7B can be implemented with the first embodiment (i.e., the logic gate of FIG. 4A) of this invention to form a NAND gate. Similarly, FIGS. 7C and 7D can be implemented with the second embodiment (i.e., the logic gate of FIG. 4B) of this invention to form a NOR gate. The basic properties surrounding operation of a NAND gate and a NOR gate have not been included so as not to cloud the present invention. Other variations of the gate input circuit 430 and the gate input circuit 435 can be made without departing from the inventive concepts described herein. Each gate input circuit has an output terminal 700 which serves as an input terminals 700 for a device in accordance with the invention.

One skilled in the art will appreciate that there is a corresponding method for operating a logic device in accordance with this invention. The method would include temporarily electrically isolating a reference node from an output node. This isolation could be accomplished through the use of a transmission gate 420 as previously described. After isolation, a first and second charge may be applied to the reference node 410 and the output node 405, respectively. These charges may be applied to the nodes 410, 405 during the device precharge state, as previously described. The charges on the reference and the output nodes 410, 405 can redistribute when the transmission gate 420 is closed. Finally, an output terminal charge may be applied to the output node 405 through the combination of two serial connected transistors, an inverter, and device input circuits.

A device in accordance with the invention offers several advantages, including a faster switching speed as a result of having the input terminals 430, 435 of the circuit isolated from the output node 405. The precharging of the reference node 410 and the output node 405 also enhances switching speed by employing only one action (i.e., a charge or a discharge) to be performed. In addition, the use of two serial transistors connected between the output node 405 and either the ground voltage or the reference voltage $V_{ref}$ also enhances speed. The two transistors reduce the delay resulting from conventional P-MOS transistors. A reduced number of gate delays per circuit occurs since the present invention enables the implementation of fast, complex gates. The gate input circuits of the present invention can be of any type or complexity without affecting the complexity and the switching speed of the basic circuit. The single-rail nature of the invention allows a reduction in the area, power efficiency, and cost in comparison with conventional logic gates. The testing of a logic device in accordance with the invention is not more difficult than some conventional circuits (e.g., domino), since the logic device is very likely to settle in the correct state. The faster switching speed allows more aggressive voltage scaling. A lower voltage supply would employ considerably less power, which can further reduce cost. Finally, the present invention can also behave like a latch without suffering the penalty of conventional latching structures.

It will be appreciated by those of ordinary skill in the art having the benefit of this disclosure that numerous variations from the foregoing illustration will be possible without departing from the inventive concept described therein. Accordingly, it is the claims set forth below, and not merely the foregoing illustration, which are intended to define the exclusive rights of the invention.

What is claimed:

1. A logic device, comprising:

an output node;

a reference node, which is electrically isolated from the output node during a first preselected portion of a clock signal;

means for applying a first reference voltage to the output node and a second reference voltage to the reference node;

means for gating a connection between the output and reference nodes during a second preselected portion of the clock signal; and means for changing voltage at the output node during the second preselected portion of the clock signal by coupling the output node to the second reference voltage.

2. The logic device of claim 1 wherein the means for applying the reference voltages includes means for applying a logically high voltage level to the output node and a logically low voltage level to the reference node, and the means for changing voltage includes means for discharging the output node to a logically low level.

3. The logic device of claim 1 wherein the means for applying the reference voltages includes means for applying a logically low voltage level to the output node and a logically high voltage level to the reference node, and the means for changing voltage includes means for charging the output node to a logically high level.

4. The logic device of claim 1, wherein the logic device performs as a NAND gate or a NOR gate.

5. The logic device of claim 1, further including logic gates which when enabled by input signals couple the first reference voltage to the output node or the second reference voltage to the output node.

6. A logic device, comprising:

an output node;

a reference node;

a first transistor having a first terminal coupled to a first reference voltage, an enable input terminal coupled to receive a clock signal, and a second terminal coupled to the output node;

a second transistor having a first terminal coupled to a second reference voltage, an enable input terminal coupled to receive the clock signal, and a second terminal coupled to the reference node;

a transmission gate having an enable input terminal coupled to receive the clock signal, a first terminal coupled to the output node, and a second terminal couple to the reference node, the transmission gate coupling the reference and output nodes together during a second preselected portion of the clock signal; and a circuit having a first enable input terminal coupled to the reference node, a second enable input terminal coupled to receive the clock signal, a first terminal coupled to the output node, and a second terminal coupled to the second reference voltage, said circuit pulling the voltage level at the output node to the second reference voltage during the second preselected portion of the clock signal.

7. The logic device of claim 6, wherein the logic device performs as a NAND gate or a NOR gate.

8. The logic device of claim 6, wherein the circuit includes a first and second transistors coupled serially between the output node and the second reference voltage, and having enable input terminals respectively coupled to the reference node and to receive the clock signal.

9. The logic device of claim 6, wherein the first reference voltage is a logically high voltage level and the second reference voltage is a logically low voltage level.

10. The logic device of claim 6, wherein the first reference voltage is a logically low voltage level and the second reference voltage is a logically high voltage level.

11. The logic device of claim 6, including a buffer coupled between the reference node and the circuit.

12. The logic device of claim 11, wherein the buffer is an inverter.

13. A logic device for delivering a predetermined output signal in response to receiving a plurality of input signals, comprising:

an output node;

a reference node;

a first transistor having a first terminal coupled to a first reference voltage, an enable input terminal coupled to receive a clock signal, and a second terminal coupled to the output node;

a second transistor having a first terminal coupled to a second reference voltage, an enable input terminal coupled to receive the clock signal, and a second terminal coupled to the reference node;

a transmission gate having an enable input terminal coupled to receive the clock signal, a first terminal coupled to the output node, and a second terminal coupled to the reference node, the transmission gate coupling the reference and output nodes together during a second preselected portion of the clock signal; and a circuit having a first enable input terminal coupled to the reference node, a second enable input terminal coupled to receive the clock signal, a first terminal coupled to the output node, and a second terminal coupled to the second reference voltage, said circuit pulling the voltage level at the output node to the second voltage reference during the second preselected portion of the clock; and a device input circuit, comprising:

a first device for coupling the first reference voltage to the output node, when the first device is enabled by one or more of the input signals; and a second device for coupling the second reference voltage to the reference node, when the second device is enabled by one or more of the input signals.

14. The logic device of claim 13 wherein the logic device performs as a NAND gate or a NOR gate.

15. The logic device of claim 13, wherein the circuit includes a first and second transistors coupled serially between the output node and the second reference voltage, and having enable input terminals respectively coupled to the reference node and to receive the clock signal.

16. The logic device of claim 13, wherein the first reference voltage is a logically high voltage level and the second reference voltage is a logically low voltage level.

17. The logic device of claim 13, wherein the first reference voltage is a logically low voltage level and the second reference voltage is a logically high voltage level.

18. The logic device of claim 13, including a buffer coupled between the reference node and the circuit.

19. The logic device of claim 18, wherein the buffer is an inverter.

20. A method of operating a fast switching logic device having a reference node and an output node, comprising:

isolating the output node from the reference node during a first portion of a clock signal;

precharging an output node to a first reference voltage;

precharging a reference node to a second reference voltage;

gating a connection between the output and reference nodes during a second portion of a clock signal;

redistributing the charge on the output node by pulling the output node toward the second reference voltage to initiate a charge or discharge of the output node; and enabling an input signal to drive the output node to a logic state based on the input signal.

21. The method of claim 20, wherein precharging the output node includes placing a high state on the output node and a low state on the reference node during the first portion of the clock signal.

22. The method of claim 21, wherein precharging the output node includes placing a low state on the output node and a high state on the reference node during the first portion of the clock signal.

23. A method of operating a fast switching logic device having a reference node and an output node in response to receiving first and second input signals, the method comprising:

isolating the output node from the reference node;

charging the output node to a logically high voltage level;

charging the reference node to a logically low voltage level;

redistributing the voltage levels placed on the output terminal and reference nodes; and pulling the output node to the logically high voltage level in response to receiving the first input signal; and pulling the output node to the logically low voltage level in response to receiving the second input signal.

24. A method of operating a fast switching logic device having a reference node and an output node in response to receiving first and second input signals, the method comprising:

isolating the output node from the reference node;

charging the output node to a logically low voltage level;

charging the reference node to a logically high voltage level;

redistributing the voltage levels placed on the output terminal and reference nodes; and pulling the output node to the logically high voltage level in response to receiving the first input terminal signal; and pulling the output node to the logically low voltage level in response to receiving the second input terminal signal.

* * * * *